United States Patent
Liu et al.

(10) Patent No.: US 12,495,694 B2
(45) Date of Patent: Dec. 9, 2025

(54) DISPLAY PANEL AND DISPLAY DEVICE

(71) Applicant: KUNSHAN GO-VISIONOX OPTO-ELECTRONICS CO., LTD., Jiangsu (CN)

(72) Inventors: Mingxing Liu, Kunshan (CN); Tian Ma, Kunshan (CN); Dong Zhao, Kunshan (CN); Yu Wang, Kunshan (CN); Jing Shao, Kunshan (CN); Yang Shao, Kunshan (CN)

(73) Assignee: KUNSHAN GO-VISIONOX OPTI-ELECTRONICS CO., LTD., Kunshan (CN)

( * ) Notice: Subject to any disclaimer, the term of this patent is extended or adjusted under 35 U.S.C. 154(b) by 554 days.

(21) Appl. No.: 18/152,332

(22) Filed: Jan. 10, 2023

(65) Prior Publication Data
US 2023/0225171 A1 Jul. 13, 2023

Related U.S. Application Data

(63) Continuation of application No. PCT/CN2021/098912, filed on Jun. 8, 2021.

(30) Foreign Application Priority Data

Sep. 2, 2020 (CN) .......................... 202010910315.5

(51) Int. Cl.
*H10K 59/35* (2023.01)
*H10K 50/805* (2023.01)
*H10K 59/122* (2023.01)

(52) U.S. Cl.
CPC ......... *H10K 59/353* (2023.02); *H10K 59/351* (2023.02)

(58) Field of Classification Search
CPC .. H10K 59/353; H10K 59/351; H10K 59/352; H10K 59/122; H10K 50/805
See application file for complete search history.

(56) References Cited

U.S. PATENT DOCUMENTS 8,502,758 B2 * 8/2013 Beland .................. G09F 9/33
                                                       345/55
9,312,312 B1    4/2016 Tsai
(Continued)

FOREIGN PATENT DOCUMENTS

CN      104701341 A    6/2015
CN      205355055 U    6/2016
(Continued)

OTHER PUBLICATIONS

International Search Report (International Application No. PCT/CN2021/098912) with English Translation, dated Sep. 13, 2021, 5 pages.
(Continued)

*Primary Examiner* — Mohsen Ahmadi
(74) *Attorney, Agent, or Firm* — Quarles & Brady LLP

(57) ABSTRACT

The present disclosure provides a display panel and a display device. The display panel includes a substrate and a pixel electrode layer disposed on the substrate. The pixel electrode layer includes pixel electrode groups arranged in an array in the first direction and second direction. Each pixel electrode group includes a first sub-pixel electrode and a third sub-pixel electrode arranged in the third direction, and a second sub-pixel electrode and a fourth sub-pixel electrode arranged in the fourth direction. The first and third sub-pixel electrodes are respectively located on two sides of an imagined connecting line connecting the geometric centers of the second sub-pixel electrode and the fourth sub-pixel electrode. Projections of the second sub-pixel electrode and the first sub-pixel electrode along the first (Continued)

direction at least partially overlap. Projections of the fourth sub-pixel electrode and the third sub-pixel electrode in the first direction at least partially overlap.

19 Claims, 6 Drawing Sheets

(56) References Cited

U.S. PATENT DOCUMENTS

| | | | |
|---|---|---|---|
| 9,543,369 | B2 | 1/2017 | Lee et al. |
| 11,233,096 | B2* | 1/2022 | Huangfu .............. H10K 59/353 |
| 11,264,430 | B2* | 3/2022 | Huangfu .............. H10K 59/131 |
| 2008/0100209 | A1* | 5/2008 | Ito .................... H10K 59/80516 |
| | | | 313/504 |
| 2008/0205792 | A1* | 8/2008 | Andersen .............. G06T 3/4015 |
| | | | 382/299 |
| 2015/0162391 | A1 | 6/2015 | Kim |
| 2016/0126298 | A1* | 5/2016 | Chen .................... H10K 59/353 |
| | | | 257/40 |
| 2017/0294491 | A1 | 10/2017 | Jo et al. |
| 2018/0088260 | A1 | 3/2018 | Jin et al. |
| 2019/0140030 | A1* | 5/2019 | Huangfu .............. G09G 3/3233 |
| 2019/0252469 | A1* | 8/2019 | Xiao .................... G09G 3/3225 |
| 2020/0043990 | A1* | 2/2020 | Huangfu .............. H10K 59/123 |
| 2020/0075705 | A1 | 3/2020 | Toyomura et al. |
| 2020/0119107 | A1 | 4/2020 | Liu et al. |
| 2020/0168692 | A1 | 5/2020 | Liu et al. |
| 2021/0013277 | A1 | 1/2021 | Liu et al. |
| 2021/0066404 | A1 | 3/2021 | Huang |
| 2021/0126213 | A1 | 4/2021 | Seo et al. |
| 2021/0335911 | A1* | 10/2021 | Zhang ................. H10K 59/352 |
| 2022/0005790 | A1 | 1/2022 | Watanabe et al. |
| 2022/0208891 | A1 | 6/2022 | Liu et al. |

FOREIGN PATENT DOCUMENTS

| | | |
|---|---|---|
| CN | 206340547 U | 7/2017 |
| CN | 207781607 U | 8/2018 |
| CN | 110137214 A | 8/2019 |
| CN | 110137215 A | 8/2019 |
| CN | 110491911 A | 11/2019 |
| CN | 110518052 A | 11/2019 |
| CN | 110767694 A | 2/2020 |
| CN | 111029389 A | 4/2020 |
| CN | 111341817 A | 6/2020 |
| CN | 112038375 A | 12/2020 |
| TW | 201945338 A | 12/2019 |
| TW | 202025113 A | 7/2020 |

OTHER PUBLICATIONS

Written Opinion (International Application No. PCT/CN2021/098912) with English Translation, dated Sep. 13, 2021, 7 pages.
First Office Action (CN Application No. 2020109103155) with English Translation, dated Apr. 12, 2022, 27 pages.
Second Office Action (CN Application No. 2020109103155) with English Translation, dated Jun. 23, 2022, 21 pages.
Notification to Grant Patent Right for Invention(CN Application No. 2020109103155) with English Translation, dated Sep. 28, 2022, 7 pages.
Tai Wan First Office Action (Application No. 110123475) with English Translation, dated Dec. 14, 2021, 5 pages.

* cited by examiner

DISPLAY PANEL AND DISPLAY DEVICE

CROSS-REFERENCE TO RELATED APPLICATIONS

This application is a continuation of international patent application No. PCT/CN2021/098912, filed on Jun. 8, 2021, which claims priority to Chinese Patent Application No. 202010910315.5, entitled "DISPLAY PANEL AND DISPLAY DEVICE" filed on Sep. 2, 2020. The contents of the above-identified applications are hereby incorporated herein in their entirety by reference.

TECHNICAL FIELD

The present disclosure relates to the field of display technology, and in particular to a display panel and a display device.

BACKGROUND

With the continuous development of display technology, people have an increasing requirement for a resolution of a display panel. A high-resolution display panel has been expanding an application range due to its advantages such as high display quality. In contrast with the conventional way in which red, green and blue sub-pixels each are used in defining only one pixel, in sub-pixel rendering (SPR) technology, sub-pixels in resolution-insensitive colors at certain positions may be shared among different pixels, utilizing a difference of resolution of human eyes toward different colored sub-pixels. This technology requires relatively few sub-pixels to simulate a relatively high pixel resolution, thereby reducing the manufacturing difficulty and cost of the manufacturing process.

In the related art of display panel, to manufacture a mask more easily, the distance between adjacent sub-pixels is decreased, so that sub-pixels of the same color in adjacent rows or columns may share one opening of the mask. In this way, however, the adjacent sub-pixels of the same color, to which the human eyes are more sensitive, may be prone to be identified as one sub-pixel by the human eyes due to the small distance therebetween. Moreover, the decreased distance between adjacent sub-pixels may result in poor compactness and non-uniformity of the sub-pixels, thereby affecting the display effect. Whereas, an increased distance between adjacent sub-pixels may result in difficulty in manufacturing of the mask and an increased cost.

SUMMARY

In view of the foregoing, there is a need to provide a display panel and a display device.

According to an aspect of the present disclosure, a display panel is provided, which includes a substrate and a pixel electrode layer disposed on the substrate. The pixel electrode layer includes a plurality of pixel electrode groups arranged in an array in a first direction and in a second direction. Each of the plurality of pixel electrode groups includes a first sub-pixel electrode and a third sub-pixel electrode arranged in a third direction, and a second sub-pixel electrode and a fourth sub-pixel electrode arranged in a fourth direction. The first sub-pixel electrode and the third sub-pixel electrode are respectively located on two sides of an imagined connecting line connecting a geometric center of the second sub-pixel electrode and a geometric center of the fourth sub-pixel electrode. A projection of the second sub-pixel electrode along the first direction and a projection of the first sub-pixel along the first direction at least partially overlap. A projection of the second sub-pixel electrode along the second direction and a projection of the third sub-pixel electrode along the second direction at least partially overlap. A projection of the fourth sub-pixel electrode along the first direction and a projection of the third sub-pixel electrode along the first direction at least partially overlap. A projection of the fourth sub-pixel electrode along the second direction and a projection of the first sub-pixel electrode along the second direction at least partially overlap.

According to another aspect of the present disclosure, a display device is provided, which includes the aforementioned display panel.

DETAILED DESCRIPTION

To facilitate understanding of the present disclosure, the present disclosure will be described more thoroughly hereinafter with reference to the accompanying drawings. Embodiments of the present disclosure are given in the accompanying drawings. However, the present disclosure may be implemented in various different forms and is not limited to the embodiments described herein. The purpose of providing these embodiments is to provide a more thorough and complete understanding of the present disclosure.

An OLED display panel is driven by electric currents and includes a pixel-driving circuit connected to its OLED devices. The driving currents are provided to the OLED devices, thereby allowing the devices to emit lights. The OLED devices each at least include an anode, a cathode, and an organic light-emitting material located between the anode and the cathode. Taking a method for manufacturing a top-emitting OLED display panel as an example, a conventional etching process may be unable to be used in patterning the organic light-emitting material due to poor stability of the organic light-emitting material, and instead, an evaporation process using a mask is adopted. The organic light-emitting material is placed in a vacuum and is evaporated or sublimated by heating the organic material. The mask is arranged between a cavity for evaporating the organic material and an array substrate to which the organic material is to be deposited. The mask has openings corresponding to deposition regions, while there are no openings in the mask corresponding to non-deposition regions. The evaporated or sublimated molecules of the organic material travel through the openings and are attached to the array substrate, thereby directly forming a patterned organic material layer on the array substrate. The mask used in the evaporation for forming the light-emitting material layer for each sub-pixel is a fine metal mask (FMM), and is abbreviated as a mask. In the manufacturing of the OLED display panel with more pixels per inch (PPI), the technical points are the FMM with good precision and mechanical stability as well as the arrangement of the pixels.

Figure 1:
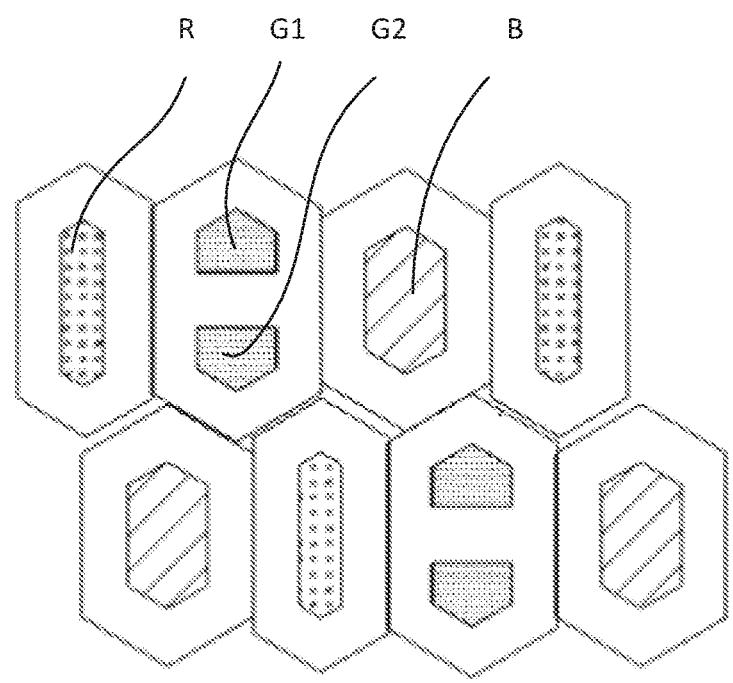
FIG. 1 is a schematic view of a pixel arrangement in the related art.

In the related art, the sub-pixel rendering technology is used to improve the resolution of the display panel. Conventionally, each pixel includes three sub-pixels, while in the sub-pixel rendering technology, each pixel includes only two sub-pixels. Therefore, by adopting the sub-pixel rendering technology, the number of pixels on the display panel is increased by 50% when the number of sub-pixels is unchanged, resulting in an improved resolution. However, since each pixel in the sub-pixel rendering technology includes only two sub-pixels, a neighboring sub-pixel is borrowed to achieve a full-color display. In the related art, adjacent green sub-pixels may share an evaporation opening of the mask for facilitating the manufacturing of the mask. As an example, for the pixel arrangement structure shown in FIG. 1, two adjacent green sub-pixels G1 and G2 in the same row may share an evaporation opening of the mask. Since human eyes are more sensitive to green, the two green sub-pixels G1 and G2 are easily identified by human eyes as one sub-pixel, thereby affecting the display effect of an image. In addition, with the decrease of the distance between the two green sub-pixels G1 and G2, the distance between the blue sub-pixel B and the red sub-pixel R needs to be appropriately increased. Therefore, the arrangement of the sub-pixels of the entire pixel arrangement structure is not uniform and compact enough, which affects the display effect.

Embodiments of the present disclosure provide a display panel and a display device that can better alleviate the aforementioned problems. Some embodiments of the display panel and the display device can ensure uniform and compact arrangement of sub-pixels, prevent adjacent sub-pixels of the same color to which the human eyes are more sensitive from being identified as one sub-pixel and allow a corresponding mask to be easily manufactured, thereby improving the display effect and reducing the manufacturing cost.

Figure 2:
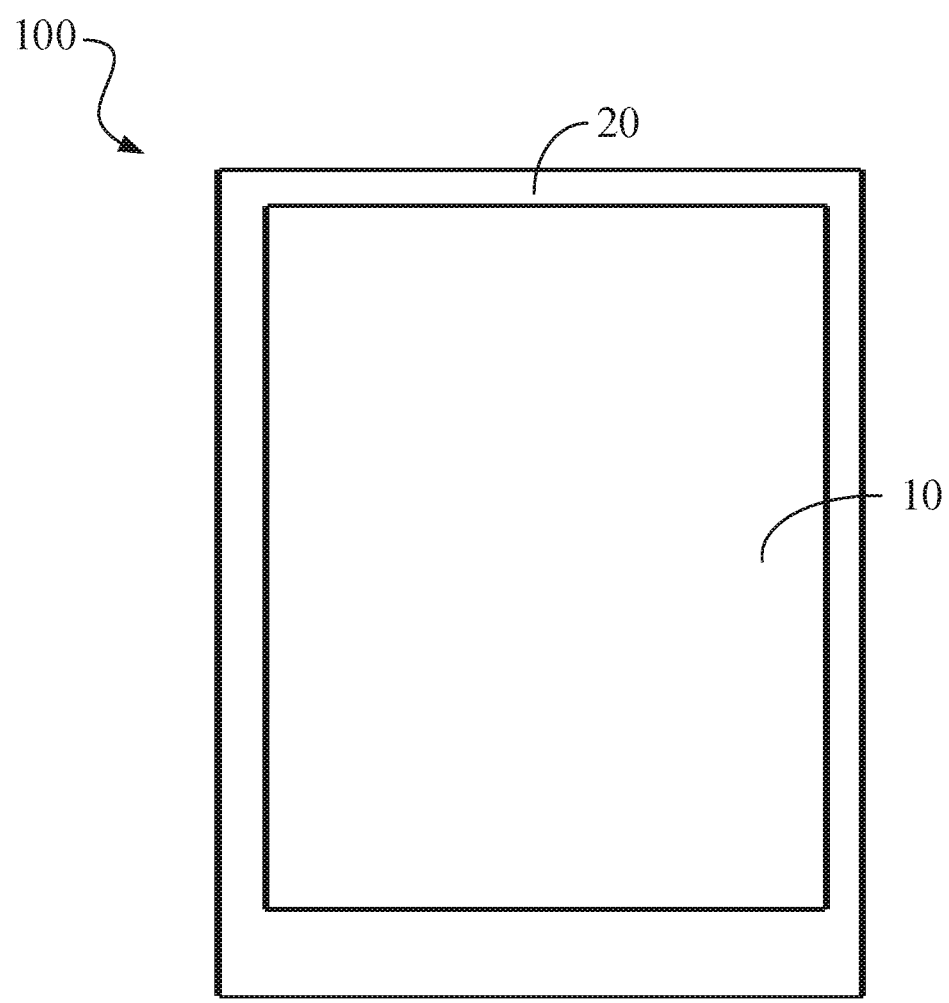
FIG. 2 is a schematic view of a display panel according to an embodiment of the present disclosure.

Referring to FIG. 2, the display panel 100 according to an embodiment of the present disclosure includes a substrate 20 and a display region 10. Display region 10 includes a plurality of sub-pixels to display an image. Specifically, the display region 10 can be rectangular. The shape and arrangement of the display region 10 and the substrate 20 can be as the above example but is certainly not limited to this. For example, when the display panel 100 is applied in a wearable device to be worn by a user, the display region 10 may have a round shape like a watch. When the display panel is applied in a vehicle for displaying, the display region 10 and the substrate 20 may have round, polygonal or other shapes. The display region 10 includes a plurality of sub-pixels configured to emit lights of different colors, and the sub-pixels are defined as the smallest units configured to emit lights (for example, the smallest addressable units of the display panel 100).

Figure 3:
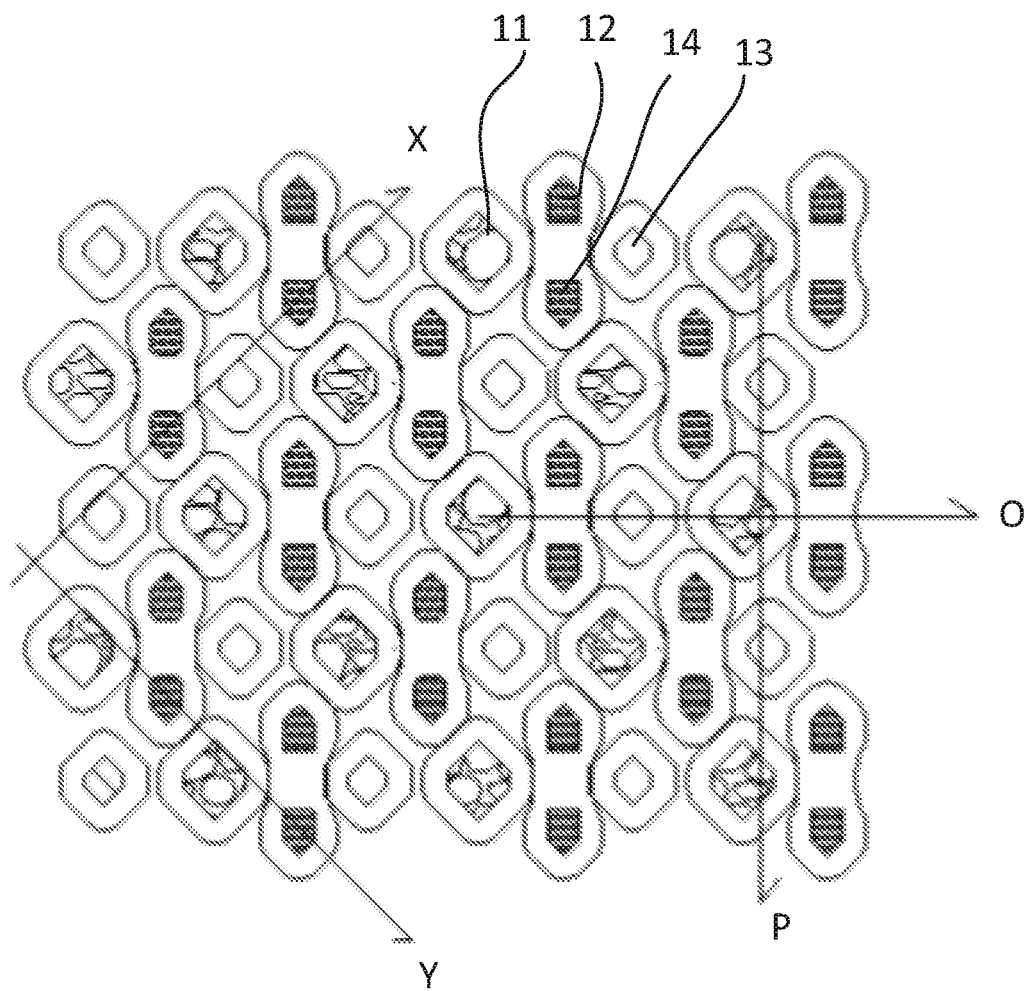
FIG. 3 is a schematic structural view of a display panel according to an embodiment of the present disclosure.

Referring to FIG. 3, in an embodiment, the display region of the display panel includes a pixel electrode layer disposed on the substrate.

The pixel electrode layer includes a plurality of pixel electrode groups, and the plurality of pixel electrode groups are arranged in an array in a first direction X and in a second direction Y. Each of the plurality of pixel electrode groups includes a first sub-pixel electrode 11 and a third sub-pixel electrode 13 arranged in a third direction O, and a second sub-pixel electrode 12 and a fourth sub-pixel electrode 14 arranged in a fourth direction P. The first sub-pixel electrode 11 and the third sub-pixel electrode 13 are respectively located on both sides of an imagined connecting line N connecting a geometric center of the second sub-pixel electrode 12 and a geometric center of the fourth sub-pixel electrode 14.

A projection of the second sub-pixel electrode 12 along the first direction X and a projection of the first sub-pixel electrode 11 along the first direction X at least partially overlap. A projection of the second sub-pixel electrode 12 along the second direction Y and a projection of the third sub-pixel electrode 13 along the second direction Y at least partially overlap.

A projection of the fourth sub-pixel electrode 14 along the first direction X and a projection of the third sub-pixel electrode 13 along the first direction X at least partially overlap. A projection of the fourth sub-pixel electrode 14 along the second direction Y and a projection of the first sub-pixel electrode 11 along the second direction Y at least partially overlap.

In this embodiment, the projections of the first sub-pixel electrode 11 and the second sub-pixel electrode 12 along the first direction X at least partially overlap, and the projections of the second sub-pixel electrode 12 and the third sub-pixel electrode 13 along the second direction Y at least partially overlap, the projections of the third sub-pixel electrode 13 and the fourth sub-pixel electrode 14 along the first direction X at least partially overlap, and the projections of the fourth sub-pixel electrode 14 and the first sub-pixel electrode 11 along the second direction Y at least partially overlap. Thus, the sub-pixels can be as much as possible closely arranged, the distribution uniformity of the human eye-sensitive color sub-pixels is improved, the visual resolution is increased, and the display quality is promoted.

The first sub-pixel electrode 11, the second sub-pixel electrode 12, the third sub-pixel electrode 13, and the fourth sub-pixel electrode 14 are spaced apart from each other. In an embodiment, the second sub-pixel electrode 12 and the fourth sub-pixel electrode 14 are respectively located on both sides of an imagined connecting line M connecting a geometric center of the first sub-pixel electrode 11 and a geometric center of the third sub-pixel electrode 13.

The first sub-pixel electrode 11, the second sub-pixel electrode 12, the third sub-pixel electrode 13 and the fourth sub-pixel electrode 14 can be anodes or cathodes of sub-pixels which are respectively red, blue, and green. The second sub-pixel electrode 12 and the fourth sub-pixel electrode 14 can be same-side electrodes of the same sub-pixel. Certainly, in other embodiments, each of the first sub-pixel electrode 11, the second sub-pixel electrode 12, the third sub-pixel electrode 13, and the fourth sub-pixel electrode 14 can be an anode or a cathode of a sub-pixel emitting light with a color other than red, green and blue, but e.g., white or yellow, which is not limited herein. It shall be understood that lights with different colors have different wavelengths. The shorter the wavelength, the larger the energy of light. Light with larger energy is more likely to decay the organic light-emitting material so the sub-pixels emitting photons with larger energy are more likely to decay. It is well-known that the wavelength of blue light is shorter than the wavelength of any one of red light and green light so the energy of blue light is relatively large, and the organic light-emitting material emitting blue light is more likely to decay. Thus, the light emitted from the pixel unit is prone to be reddish, resulting in a color shift in white light emission. In addition, since the light emitted by each sub-pixel is repeatedly reflected and re-reflected between the anode and the cathode due to the microcavity effect, amplification and a constructive interference happen on the light, the brightness of the light is increased, and thus the color shift is further amplified. In an embodiment, an area of the sub-pixel electrode of the blue sub-pixel is larger than each of an area of the sub-pixel electrode of the red sub-pixel and an area of the sub-pixel electrode of the green sub-pixel. In this way, display defects caused by the difference in attenuation rates of the organic light-emitting materials, emitting lights of different colors, can be reduced to a certain extent. For example, in the embodiment shown in FIG. 3, the first sub-pixel electrode 11 is an anode of a blue sub-pixel, the third sub-pixel 13 is an anode of a red sub-pixel, and the second sub-pixel electrode 12 and the fourth sub-pixel electrode 14 are respectively anodes of green sub-pixels. Accordingly, the area of the first sub-pixel electrode 11 is larger than the area of the third sub-pixel electrode 13, the area of the third sub-pixel electrode 13 is larger than the area of the second sub-pixel electrode 12 or the fourth sub-pixel electrode 14, and the second sub-pixel electrode 12 and the fourth sub-pixel electrode 14 are of a same area. In some embodiments, an area of the sub-pixel electrode of the green sub-pixel may be the same as that of the sub-pixel electrode of the red sub-pixel. However, since human eyes are more sensitive to green light, in some other embodiments, an area of the sub-pixel electrode of the green sub-pixel may be smaller than that of the sub-pixel electrode of the red sub-pixel, which is not limited herein.

On this basis, as shown in FIG. 3, in a determined one pixel electrode group of the plurality of pixel electrode groups and a pixel electrode group adjacent to this determined pixel electrode group in the first direction X or in the second direction Y, a projection of the first sub-pixel electrode 11 in the determined one pixel electrode group along the fourth direction P and a projection of the third sub-pixel electrode 13 in another pixel electrode group along the fourth direction P at least partially overlap, so that the sub-pixels are more closely arranged. Moreover, such arrangement prevents the sub-pixels corresponding to the second sub-pixel electrode 12 and the fourth sub-pixel electrode 14 in the same sub-pixel electrode group from being too close to the sub-pixels corresponding to the second sub-pixel electrode 12 and the fourth sub-pixel electrode 14 in an adjacent same sub-pixel electrode group. When the second sub-pixel electrode 12 and the fourth sub-pixel electrode 14 are anodes or cathodes of two green sub-pixels respectively, the two green sub-pixels in the two adjacent pixel groups are less likely to be too close, which prevents the two adjacent green sub-pixels from being difficult to distinguish and identified as one sub-pixel due to that the two adjacent green sub-pixels are relatively close. Moreover, such an arrangement enables the light-emitting material corresponding to the second sub-pixel electrode 12 and the fourth sub-pixel electrode 14 in the same sub-pixel electrode group to use the same opening of the mask.

Figure 4:
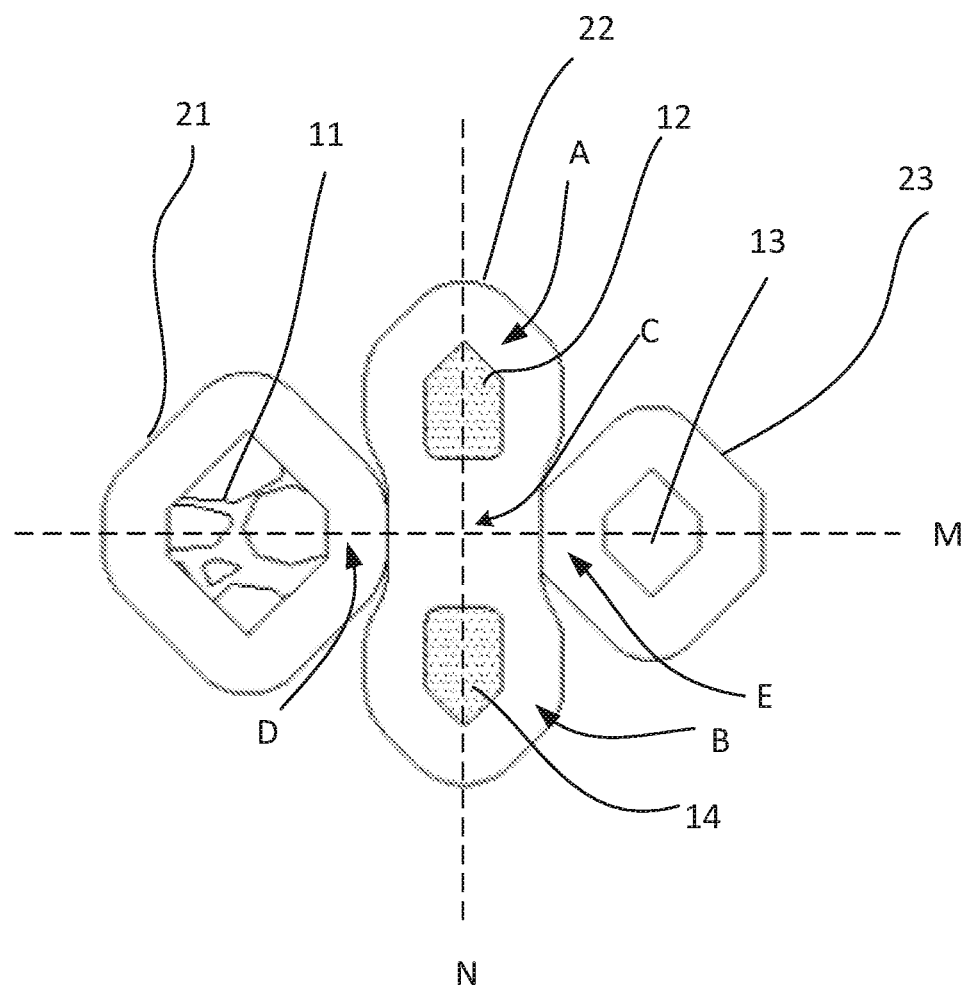
FIG. 4 is a schematic structural view of a sub-pixel electrode group and a corresponding pixel light-emitting material group according to an embodiment of the present disclosure.

In some embodiments of the present disclosure, the display panel further includes a light-emitting material layer disposed on the pixel electrode layer. Referring to FIG. 3 and FIG. 4, the light-emitting material layer includes a plurality of pixel light-emitting material groups corresponding to the plurality of pixel electrode groups in one-to-one correspondence. Each of the plurality of pixel light-emitting material groups includes a first light-emitting material portion 21, a second light-emitting material portion 22, and a third light-emitting material portion 23 sequentially arranged in the third direction O.

In the pixel electrode group and its corresponding pixel light-emitting material group, the first sub-pixel electrode 11 is located within a vertical projection of the first light-emitting material portion 21 on the substrate 20, the third sub-pixel electrode 13 is located within a vertical projection of the third light-emitting material portion 23 on the substrate 20, and the second sub-pixel electrode 12 and the fourth sub-pixel electrode 14 are located within a vertical projection of the second light-emitting material portion 22 on the substrate 20.

In each pixel, light-emitting material group, the second light-emitting material portion 22 includes a first expansion part A and a second expansion part B being arranged in the fourth direction P and symmetrical with an imagined connecting line M connecting geometric centers of the first sub-pixel electrode 11 and the third sub-pixel electrode 13, and the second light-emitting material portion 22 also includes a transition part C connected between the first expansion part A and the second expansion part B. The transition part C has two concave lateral edges which are concave towards an imagined connecting line N connecting geometric centers of the second sub-pixel electrode 12 and the fourth sub-pixel electrode 14. The first light-emitting material portion 21 has a first protruding part D extending towards one of the two concave lateral edges adjacent thereto. The third light-emitting material portion 23 has a second protruding part E extending towards another one of the two concave lateral edges adjacent thereto. The first expansion part A, the second expansion part B, and the transition part C are of an integrated structure. That is, the second light-emitting material portion 22 is a continuous entity. An intersection point of the imagined connecting line N and the imagined connecting line M can be located in the second light emitting material portion 22.

Neighboring first light-emitting material portion 21, second light-emitting material portion 22 and third light-emitting material portion 23 can be in contact with each other or can be spaced apart from each other. In an embodiment, the first light-emitting material portion 21 and the third light-emitting material portion 23 each include two opposite sides parallel to the first direction X and two opposite sides parallel to the second direction Y. A shape of the first light-emitting material portion 21 can correspond to a shape of the first sub-pixel electrode 11, and a shape of the third light-emitting material portion 23 can correspond to a shape of the third sub-pixel electrode 13. In an embodiment, the material of the first light-emitting material portion 21 is a blue light-emitting material, the material of the third light-emitting material portion 23 is a red light-emitting material, and the material of the second light-emitting material portion 22 is a green light-emitting material. An area of the first light-emitting material portion 21 is greater than that of the third light-emitting material portion 23.

It should be noted that in the above embodiments, an included angle between each of the third direction O and the fourth direction P and each of the first direction X and the second direction Y is an acute angle. In an embodiment, the first direction X and the second direction Y are orthogonal, and the third direction O and the fourth direction P are orthogonal. In each pixel electrode group, the imagined connecting line N connecting geometric centers of the second sub-pixel electrode 12 and the fourth sub-pixel electrode 14 is parallel to the fourth direction P, the imagined connecting line M connecting geometric centers of the first sub-pixel electrode 11 and the third sub-pixel electrode 13 is parallel to the third direction O.

Figure 5:
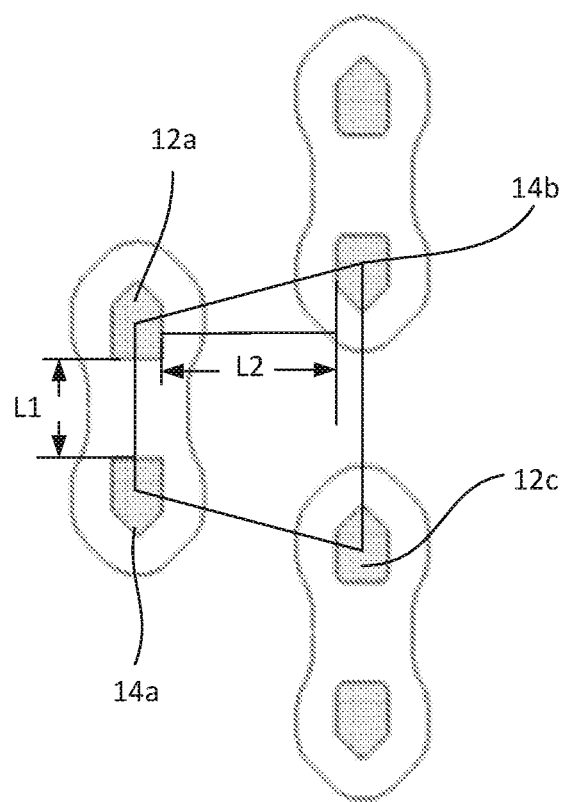
FIG. 5 is a schematic structural view showing a part of the display panel of the embodiment in FIG. 3.

Referring to FIG. 3 and FIG. 5, in some embodiments of the present disclosure, any pixel electrode group can be taken as a first pixel electrode group, a pixel electrode group adjacent to the first pixel electrode group in the first direction is taken as a second pixel electrode group, and a pixel electrode group adjacent to the first pixel electrode group in the second direction is taken as a third pixel electrode group. A first virtual quadrangle is formed by an imagined connecting line sequentially connecting geometric centers of the fourth sub-pixel electrode 14a and the second sub-pixel electrode 12a in the first pixel electrode group, a geometric center of the fourth sub-pixel electrode 14b in the second pixel electrode group, and a geometric center of the second sub-pixel electrode 12c in the third pixel electrode group. The minimum interior angle of the first virtual quadrangle is greater than or equal to 60° and less than or equal to 90°.

The minimum distance between the second sub-pixel electrode 12a and the fourth sub-pixel electrode 14a in the first pixel electrode group is L1, a projection of the minimum distance between the fourth sub-pixel electrode 14b in the second pixel electrode group and the second sub-pixel electrode 12a in the first pixel electrode group, along the fourth direction P, has a length L2, wherein L1<L2<2L1.

Figure 6:
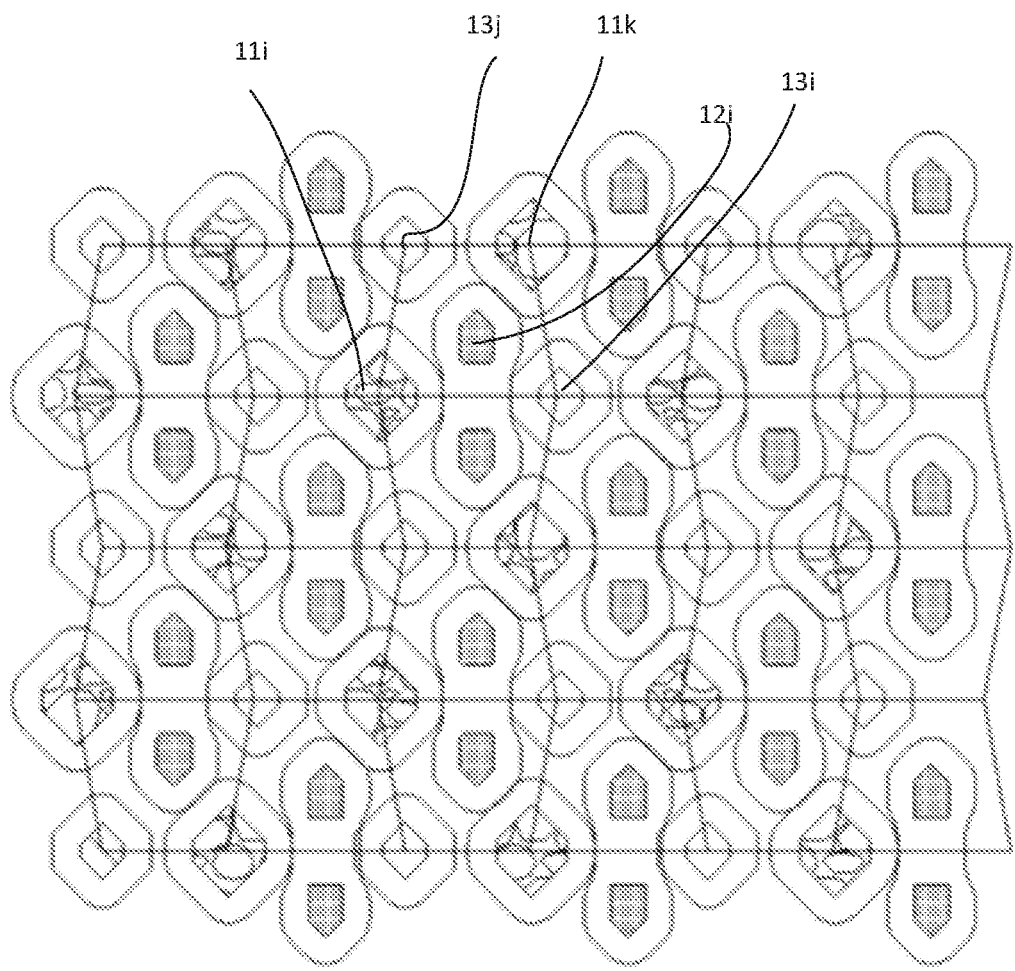
FIG. 6 is a schematic structural view of a display panel according to another embodiment of the present disclosure.

Referring to FIG. 6, in some embodiments of the present disclosure, geometric centers of one first sub-pixel electrode 11k and one third pixel electrode 13j closest to one second sub-pixel electrode 12i serve as two vertexes, wherein the one first sub-pixel electrode 11k, the one third pixel electrode 13j, and the one second sub-pixel electrode 12i belong to different pixel electrode groups. Geometric centers of another first sub-pixel electrode 11i and another third pixel electrode 13i serve as another two vertexes, wherein the one second sub-pixel electrode 12i, the other first sub-pixel electrode 11i, and the other third pixel electrode 13i belong to the same pixel electrode group. The former two vertexes and the latter two vertexes form a second virtual quadrangle with a minimum interior angle greater than or equal to 75°.

Based on the same inventive concept, the present disclosure further provides a display device, which includes the display panel 100 in the aforementioned embodiments.

Specifically, the display device can be applied to the fields such as mobile phone terminals, bionic electronics, electronic skins, wearable devices, in-vehicle devices, Internet of Things devices, and artificial intelligence devices. For example, the above display device can be a digital device such as a mobile phone, a tablet, a palmtop computer, an iPod, or a smartwatch.

The technical features of the above-described embodiments may be arbitrarily combined. To make the description simple, not all possible combinations of the technical features in the above embodiments are described. However, in the case that there is no contradiction in the combination of these technical features, these combinations should be considered to be within the scope of the present disclosure.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the application protection of the present disclosure shall be defined by the appended claims.

What is claimed is:

1. A display panel, comprising a substrate and a pixel electrode layer disposed on the substrate, wherein: the pixel electrode layer comprises a plurality of pixel electrode groups arranged in an array in a first direction and in a second direction; each of the plurality of pixel electrode groups comprises a first sub-pixel electrode and a third sub-pixel electrode arranged in a third direction, and a second sub-pixel electrode and a fourth sub-pixel electrode arranged in a fourth direction, the first sub-pixel electrode and the third sub-pixel electrode are respectively located on two sides of an imagined connecting line connecting a geometric center of the second sub-pixel electrode and a geometric center of the fourth sub-pixel electrode;

a projection of the second sub-pixel electrode along the first direction and a projection of the first sub-pixel along the first direction at least partially overlap, and a projection of the second sub-pixel electrode along the second direction and a projection of the third sub-pixel electrode along the second direction at least partially overlap;

a projection of the fourth sub-pixel electrode along the first direction and a projection of the third sub-pixel electrode along the first direction at least partially overlap, and a projection of the fourth sub-pixel electrode along the second direction and a projection of the first sub-pixel electrode along the second direction at least partially overlap;

wherein in a determined one of the plurality of pixel electrode groups and a pixel electrode group adjacent to the determined one of the plurality of pixel electrode groups in the first direction or the second direction, a projection of the first sub-pixel electrode of the determined one pixel electrode group along the fourth direction and a projection of the third sub-pixel electrode of another pixel electrode group along the fourth direction at least partially overlap.

2. The display panel according to claim 1, further comprising:

a light-emitting material layer disposed on the pixel electrode layer;

wherein the light-emitting material layer comprises a plurality of pixel light-emitting material groups corresponding to the plurality of pixel electrode groups in one-to-one correspondence; the pixel light-emitting material group comprises a first light-emitting material portion, a second light-emitting material portion, and a third light-emitting material portion sequentially arranged in the third direction;

in the pixel electrode group and a corresponding pixel light-emitting material group, the first sub-pixel electrode is located within a vertical projection of the first light-emitting material portion on the substrate, the third sub-pixel electrode is located within a vertical projection of the third light-emitting material portion on the substrate, and the second sub-pixel electrode and the fourth sub-pixel electrode are located within a vertical projection of the second light-emitting material portion on the substrate.

3. The display panel according to claim 2, wherein in the pixel electrode group, the second light-emitting material portion comprises:

a first expansion part and a second expansion part arranged in the fourth direction and symmetrical with an imagined connecting line connecting geometric centers of the first sub-pixel electrode and the third sub-pixel electrode, and a transition part connected between the first expansion part and the second expansion part.

4. The display panel according to claim 3, wherein the transition part comprises two concave lateral edges concaved towards the imagined connecting line connecting the geometric centers of the second sub-pixel electrode and the fourth sub-pixel electrode.

5. The display panel according to claim 4, wherein the first light-emitting material portion comprises a first protruding part extending towards one of the two concave lateral edges adjacent thereto, and the third light-emitting material portion comprises a second protruding part extending towards another one of the two concave lateral edges adjacent thereto.

6. The display panel according to claim 2, wherein each of the first light-emitting material portion and the third light-emitting material portion comprises two opposite sides parallel to the first direction and two opposite sides parallel to the second direction.

7. The display panel according to claim 2, wherein a material of the first light-emitting material portion is a blue light-emitting material, a material of the third light-emitting material portion is a red light-emitting material, and a material of the second light-emitting material portion is a green light-emitting material; an area of the first light-emitting material portion is greater than that of the third light-emitting material portion.

8. The display panel according to claim 1, wherein:
an included angle between each of the third direction and the fourth direction and each of the first direction and the second direction is an acute angle;
the first direction and the second direction are orthogonal; and
the third direction and the fourth direction are orthogonal.

9. The display panel according to claim 8, wherein in the pixel electrode group, the imagined connecting line connecting the geometric centers of the second sub-pixel electrode and the fourth sub-pixel electrode is parallel to the fourth direction, and an imagined connecting line connecting geometric centers of the first sub-pixel electrode and the third sub-pixel electrode is parallel to the third direction.

10. The display panel according to claim 9, wherein one of the plurality of pixel electrode groups is taken as a first pixel electrode group, a pixel electrode group adjacent to the first pixel electrode group in the first direction is taken as a second pixel electrode group, and a pixel electrode group adjacent to the first pixel electrode group in the second direction is taken as a third pixel electrode group; a first virtual quadrangle is formed by an imagined connecting line sequentially connecting the geometric centers of the fourth sub-pixel electrode and the second sub-pixel electrode in the first pixel electrode group, the geometric center of the fourth sub-pixel electrode in the second pixel electrode group, and the geometric center of the second sub-pixel electrode in the third pixel electrode group; a minimum interior angle of the first virtual quadrangle is greater than or equal to 60° and less than or equal to 90°.

11. The display panel according to claim 10, wherein a minimum distance between the second sub-pixel electrode and the fourth sub-pixel electrode in the first pixel electrode group is L1, a projection of a minimum distance between the fourth sub-pixel electrode in the second pixel electrode group and the second sub-pixel electrode in the first pixel electrode group along the fourth direction has a length L2, wherein L1<L2<2L1.

12. The display panel according to claim 11, wherein geometric centers of one first sub-pixel electrode and one third pixel electrode closest to one second sub-pixel electrode are two vertexes of a second virtual quadrangle, the one first sub-pixel electrode, the one third pixel electrode, and the one second sub-pixel electrode being belonged to different pixel electrode groups, and geometric centers of another first sub-pixel electrode and another third pixel electrode are another two vertexes of the second virtual quadrangle, the one second sub-pixel electrode, the other first sub-pixel electrode, and the other third pixel electrode being belonged to a same pixel electrode group; a minimum interior angle of the second virtual quadrangle is greater than or equal to 75°.

13. The display panel according to claim 1, wherein an area of the first sub-pixel electrode is larger than an area of the third sub-pixel electrode, and an area of the second sub-pixel electrode is equal to an area of the fourth sub-pixel electrode.

14. The display panel according to claim 1, wherein the second sub-pixel electrode and the fourth sub-pixel electrode are respectively located on two sides of an imagined connecting line connecting a geometric center of the first sub-pixel electrode and a geometric center of the third sub-pixel electrode; or
the second sub-pixel electrode and the fourth sub-pixel electrode are same-side electrodes of a same sub-pixel.

15. The display panel according to claim 1, wherein the first sub-pixel electrode is an anode of a blue sub-pixel.

16. The display panel according to claim 1, wherein the third sub-pixel electrode is an anode of a red sub-pixel.

17. The display panel according to claim 1, wherein the second sub-pixel electrode and the fourth sub-pixel electrode are two anodes of a same green sub-pixel.

18. The display panel according to claim 1, wherein the display panel is an OLED display panel.

19. A display device comprising the display panel according to claim 1.

* * * * *